United States Patent [19]
Akulow et al.

[11] Patent Number: 5,163,219
[45] Date of Patent: Nov. 17, 1992

[54] PRINTED WIRING EXTENDER CARD SEPARATOR TOOL

[75] Inventors: Orest B. Akulow, Villa Park; James C. Budzynski, Darien; Andrew J. Karkowski, Chicago, all of Ill.

[73] Assignee: AG Communication Systems Corporation, Phoenix, Ariz.

[21] Appl. No.: 766,301

[22] Filed: Sep. 27, 1991

[51] Int. Cl.⁵ .......................... H05K 3/36; H05K 7/14
[52] U.S. Cl. .......................... 29/764; 29/267; 361/413; 361/414
[58] Field of Search .......................... 29/764, 267, 758; 361/412-414, 399

[56] References Cited

U.S. PATENT DOCUMENTS

| | | | |
|---|---|---|---|
| 4,334,376 | 6/1982 | Winslow | 29/267 X |
| 4,377,906 | 3/1983 | Bertellotti et al. | 29/764 X |
| 4,519,130 | 5/1985 | Schaefer | 29/764 |
| 4,768,271 | 9/1988 | Jacob et al. | 29/267 |

*Primary Examiner*—Carl E. Hall
*Attorney, Agent, or Firm*—Robert J. Black; Gregory G. Hendricks

[57] ABSTRACT

A tool for separating a printed wiring card under test from an extender card operated in response to insertion of a portion of the tool into a space between the extender card and the card under test and rotation of the tool, facilitating the complete separation of the card under test from the extender card.

3 Claims, 1 Drawing Sheet

PRINTED WIRING EXTENDER CARD SEPARATOR TOOL

BACKGROUND OF THE INVENTION

1. Field of the Invention

The present invention relates to printed wiring cards and more particularly to a tool useful for separating printed wiring circuit cards from printed wiring extender cards used during testing and maintenance procedures.

2. Background Art

Many operations, particularly those of telephone central office switching systems and similar computer controlled systems, utilize substantial numbers of printed wiring cards fitted into backplanes or card cage areas on a vertical basis. A number of these cards placed vertically on a side by side basis may equal 30, 40 or 50 or more cards. To perform maintenance or testing on these cards because of the presence of adjacent cards on either side of the card to be worked on is exceedingly difficult because of very tight clearances provided between adjacent cards.

To facilitate testing or maintenance, so-called "extender cards" are employed. In this manner, the card to be tested or worked on is removed from the card cage or backplane and an extender card is plugged into its place. The extender card then merely carries all of the appropriate connections to its rear where a separate connector is available and then the card to be worked on is then plugged into the rear portion of the connector at the back end of the extender card. In this way, the card to be worked on is readily available and is no longer located between two adjacent cards. The extender card is attached to the backplane and the card to be worked on is available with both sides open to a test or repair man wishing to work upon the card.

Printed wiring cards, particularly those employed in the telephone industry, usually have 330 or 440 pin connectors. When these cards are usually plugged directly into the card cage, ejector levers on the card are then used to unplug the card. However, when the card to be tested is plugged into an extender card, the combination of both of them being plugged into the card cage, the ejector levers are inoperative as far as the printed wiring card to be tested is concerned. In this arrangement the retention force of 330 or 440 pins is great enough to make the separation of the extender card from the other printed wiring card extremely difficult.

Usually by "sawing" (moving back and forth with a rocking motion) the card under test is worked out gradually. In this manner usually one side will come free before the other and the card then cocks at an angle stressing the extender card guide arms and perhaps damaging the power guide pins. The repetition of such action will eventually loosen or bend extender card guide arms as well as possibly damaging the electrical pins. Some maintenance personnel have found that cards can be separated using a tool such as a screwdriver or scissors to pry the cards apart. While preventing the kind of damage described above, particularly in reference to the power guide pins or the extender card guide arms, prying on the connector itself can damage or crack the housing and electrical pins may be momentarily shorted.

It is the object of the present invention to provide an appropriate tool to overcome the problems inherent in the prior art.

SUMMARY OF THE INVENTION

The present extender card separator tool in accordance with the present invention overcomes the above outlined problems. In operation, the tool acts to pry the cards apart with a gentle cam action that does not damage the guide arms, power guide pins, or connector housing and its location and use are such that the electrical pins of the related connectors will not be shorted.

The tool itself is made of hardened aluminum and is approximately 4¾" long, one end is the handle portion and at the opposite end is a round section with a right angular jaw section included therein. Each jaw of the jaw section is at right angles to the other and is approximately ⅜" long. The remainder of the head has a 90 degree elliptical curve which acts as a cam during operation or utilization of the tool.

In operation, the tool is inserted between the top of the two cards in a space between the connector housing and the guide arm. The notch or jaw area in the tool is used as a pivot. As the tool is rotated, the elliptically curved surface acts as a cam, pushing the cards apart just far enough to disengage the contacts. The procedure is then repeated at the bottom end of the connector which is virtually identical to the top end. Thus the card under test now disengaged can be easily slid out of the card guides extending from the extender card. The arrangement with the length of the handle and the angle between the handle and head of the tool have been designed so as not to interface with the card cage yet provide sufficient freedom of motion so that the tool may be easy to use and adequate pressure developed by the user to effectively separate the cards without the need of excessive force.

DESCRIPTION OF THE PREFERRED EMBODIMENT

Figure 1:
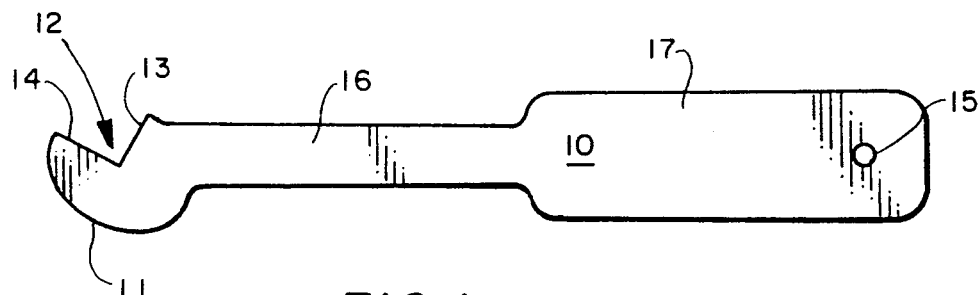
FIG. 1 is a top view of the printed wiring extended card separator tool in accordance with the present invention.

Referring first to FIG. 1, a top plan view of the tool in accordance with the presence invention shown is shown. The tool itself is approximately 4¾" long, at the widest part of the handle it is approximately ¾" wide. The tool is made of 0.125" thick hardened aluminum with a clear anodized finish. All edges are rounded over and are made free of burrs so as to facilitate ease of use.

The tool 10 consists of a head portion 11, a handle portion 17 with the head portion 11 joined to the handle portion 17 by a shank portion 16. The head portion consists of one side having a 90 degree arc elliptical curve with the lower or minor axis having a 0.38 radius while the upper or major axis has a 0.55 axis. Opposite the curved portion of the head is a notch or jaw portion 12 with horizontal jaw 13 and vertical jaw 14 positioned at right angles to each other. Each jaw is approximately 0.38" in length. The shank portion is approximately 0.38" in width and extends to the handle portion which is approximately ¾" in width and 2.38" long. The handle portion also includes a small hole (0.13" in diameter) near its one end which may be utilized for hanging purposes or to attach a cord or similar retention means thereto.

Figure 2:
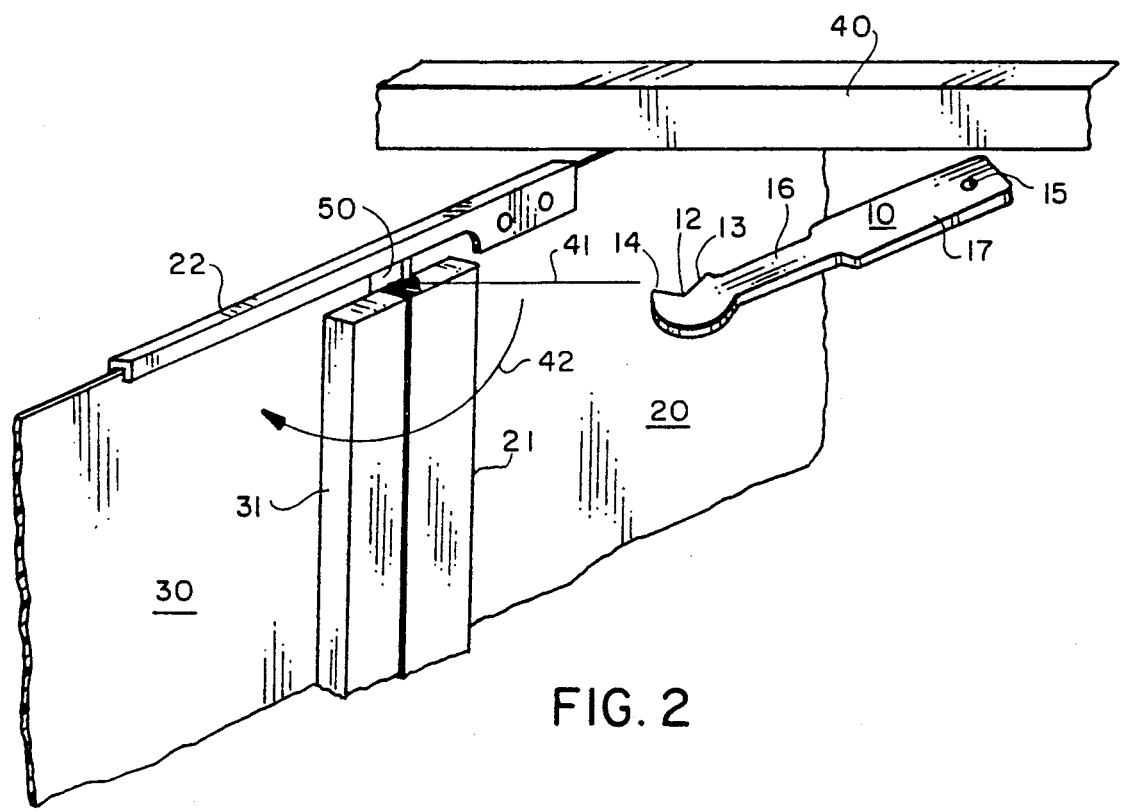
FIG. 2 is a partial perspective view of a card cage, extender card, and a printed wiring card under test showing the two cards joined with the tool in accordance with the present invention positioned adjacent thereto.

Referring now to FIG. 2, tool 10 is shown positioned adjacent to extender card 20 which is shown positioned in card cage 40. Extended card 20 includes upper card guide 22 and a lower card guide 23 (not shown). Included on the outer edge of extender card 20 is a connector section 21 which while not visible includes 330 or 440 or similar number of pin sockets.

Attached to extended card 20 is printed wiring card 30 to be tested. Connector 31 which has 330 or 440 or similar number of pins (not shown) which have been inserted into connector 21. It may be also seen from FIG. 2 an opening 50 between the card edges of card 20 and card 30 exists.

To utilize the tool in accordance with the present invention, tool 10 is moved in a forward direction along the lines shown by arrows 41 so that jaw portion 14 extends into opening 50, jaw 13 resting against printed wiring card 20 above connector 21. At this point the operator rotates the tool in a forward direction along the arc shown by arrow 42 so that the elliptically curved surface 11 pushes against card 30 in the area above connector 31. After tool 10 is rotated, the elliptically curved surface 11 forces connector 31 of card 30 away from card 20 far enough to disengage the contacts included in connector 31 from the pin receptacles in connectors 21. The operation will then be repeated at the other end of the connector which has not been shown. At this point, the card under test would be disengaged and can be easily slid out of card guides 22 and 23.

It will be obvious from the foregoing that numerous modifications of the present invention may be made without departing from the spirit of the present invention which will be limited only by the scope of the claims appended hereto.

What is claimed is:

1. In combination, a printed wiring card cage including a plurality of printed wiring cards positioned adjacent to each other and vertically oriented, said cards including a printed wiring extender card connected within said card cage, said extender card including on an outer extending edge thereof a connector adapted to receive a printed wiring card for test or maintenance purposes, a plurality of card guide arms included on the upper and lower edges of said printed wiring extender card, a printed wiring card to be tested including a connector connected to said extender card connector, said printed wiring card to be tested supported by upper and lower extender card guides, and first and second openings adjacent to said upper and lower extender card guides, respectively, between said card to be tested and said extender card; the improvement comprising:

a tool separating said printed wiring card to be tested from said extender card;

said tool including a head portion;

a handle portion;

a shank portion;

said head portion including a jaw section including first and second jaws positioned at right angles to each other, said first jaw adapted to be extended into said first opening, or in the alternative into said second opening between said extender card and said card to be tested and said second jaw positioned along side of and in engagement with a portion of said extender card and rotation of said tool, separates said card to be tested from said extender card.

2. The combination as claimed in claim 1 wherein: said tool; a handle portion; a shank portion; is constructed of hardened aluminum.

3. The combination as claimed in claim 2 wherein; said head portion includes an elliptically curved section which functions to provide a camming action in response to rotation of said tool during the separation of said card under test from said extender card.

* * * * *